United States Patent [19]
Park

[11] Patent Number: 5,698,375
[45] Date of Patent: Dec. 16, 1997

[54] PROCESS FOR FORMATION OF CAPACITOR ELECTRODE FOR SEMICONDUCTOR DEVICE

[75] Inventor: Seung Hyun Park, Seoul, Rep. of Korea

[73] Assignee: Goldstar Electron Co., Ltd., Cheongju, Rep. of Korea

[21] Appl. No.: 293,764

[22] Filed: Aug. 19, 1994

[30] Foreign Application Priority Data

Aug. 21, 1993 [KR] Rep. of Korea ............... 93-16271

[51] Int. Cl.$^6$ ............... G03F 7/40; H01L 21/70
[52] U.S. Cl. ............... 430/312; 216/6; 437/919
[58] Field of Search ............... 430/312; 216/6; 437/919

[56] References Cited

U.S. PATENT DOCUMENTS

| | | | |
|---|---|---|---|
| 3,365,378 | 1/1968 | Maissel et al. | 216/6 X |
| 3,653,898 | 4/1972 | Shaw | 430/312 |
| 5,162,253 | 11/1992 | Takeuchi | 437/919 X |
| 5,164,337 | 11/1992 | Ogawa et al. | 437/919 X |
| 5,444,010 | 8/1995 | Park et al. | 437/919 X |

OTHER PUBLICATIONS

N. Matsuo, et al.; "Tunnel Structured Stacked Capacitor Cell (TSSC) for 64 MBit dRams"; 1991 International Conference on Solid State Devices and Materials, Yokohama; pp. 475–477.

N. Shinmura, et al.; "A Stacked Capacitor Cell With Ring Structure"; 1990 Intern'l Conf. on Solid State Devices & Material, Sendai; pp. 833–834.

Hyundai Electronics Industries Co.,Ltd.;Hyundai literature pp. 399–400.

*Primary Examiner*—Cynthia Hamilton
*Attorney, Agent, or Firm*—Loudermilk & Associates

[57] ABSTRACT

The invention discloses a process for formation of a capacitor for a semiconductor device. The upper node electrode is supported by side wall spacers and a central pole, so that the supporting strength may be reinforced and the surface area may be increased. During the formation of a contact hole, a first side wall spacer is formed, and, by utilizing the first side wall spacer, a contact hole is opened with a greater margin. The upper and lower node electrodes are of a tunnel structure. The central pole of the node electrodes is provided with a hole in it, so that a conductive material may be filled into the hole to form a connecting portion. This connecting portion connects the node electrodes of the capacitor to a source/drain region which is formed on a semiconductor substrate. A thin dielectric film is deposited on the surface of the node electrode, and a plate electrode is formed thereupon, thereby completing the formation of the capacitor.

4 Claims, 9 Drawing Sheets

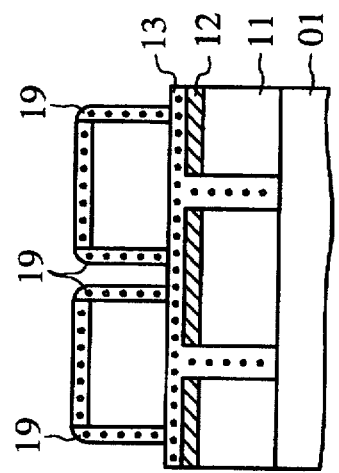
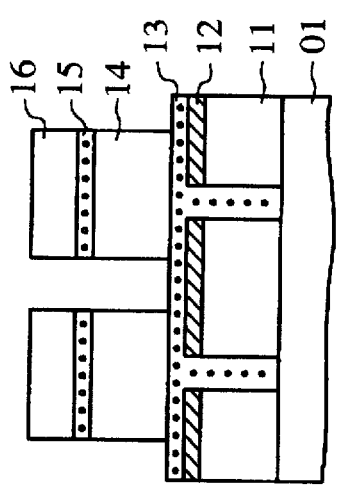
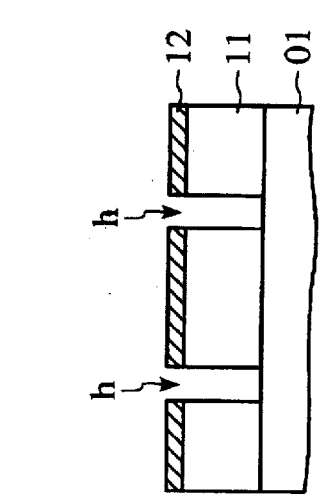
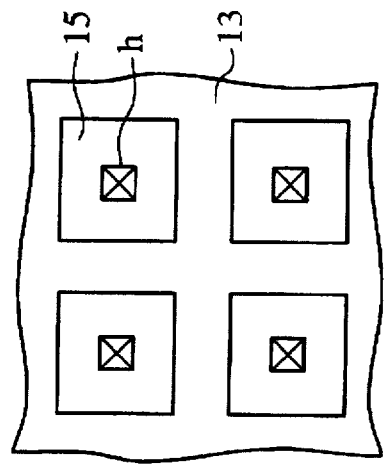
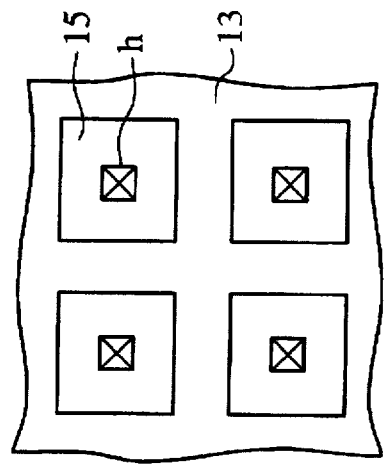
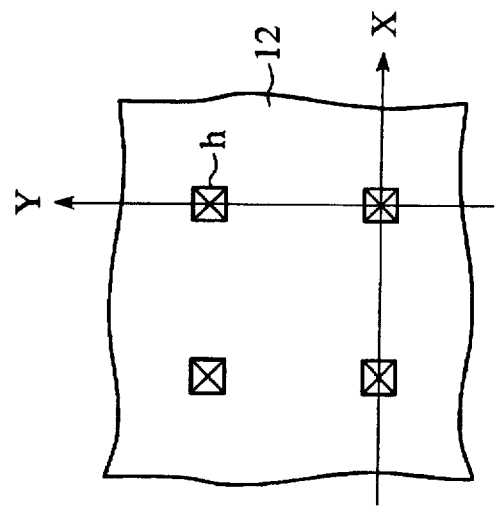

PROCESS FOR FORMATION OF CAPACITOR ELECTRODE FOR SEMICONDUCTOR DEVICE

FIELD OF THE INVENTION

The present invention relates to processes for formation of capacitor electrodes for semiconductor devices. In particular, the present invention relates to processes for formation of capacitor electrodes for semiconductor devices in which the separating distances between the capacitors are minimized to obtain a large capacitance in a high density DRAM, and two tunnels are formed to maximize the surface area of the capacitor, thereby obtaining a high capacitance.

BACKGROUND OF THE INVENTION

One of the conventional processes for formation of capacitors in a DRAM cell is carried out as described below. That is, after an active region and isolation region are formed on a substrate, circuit elements such as transistors and the like are formed. An interlayer insulating layer is deposited, and a nitride layer is deposited. A photo-etching process is carried out to open a contact hole. After formation of the contact hole, polysilicon is deposited for forming a lower node electrode of a capacitor. Thereafter an insulation layer is formed, and then polysilicon is deposited for forming an upper node electrode of the capacitor. A photo-etching is carried out for isolating the respective capacitors, thereby forming a capacitor isolating pattern. Polysilicon is deposited again, and is etched back to form a side wall for the node electrodes. After the insulating layer is removed, a dielectric layer and plate electrode are formed, and thus a capacitor is produced.

FIGS. 1A, 1B, 2A, 2B, 3A and 3B illustrate the process for formation of capacitors for the conventional semiconductor device. In these drawings, the left side drawings (i.e., 1A, 2A and 3A) are partly sectional views of the capacitors, while the right side drawings (i.e., 1AA, 1BB, 1CC) are top plan views of the capacitors.

First, with reference to FIGS. 1A and 1B, circuit elements such as transistors are formed on a silicon substrate, and then word lines and bit lines are formed. Insulating layer 11 is deposited for insulating subsequent layers from silicon substrate 01, and nitride layer 12 as another insulating layer is deposited. Then a photo etching is carried out by using a contact hole mask on the portion where the circuit elements and the capacitor electrode are to be connected to each other, thereby forming contact holes h.

Then, as shown in FIGS. 2A and 2B, polysilicon layer 13 is deposited over contact holes h and on insulating layer 12 for forming a lower node electrode of the capacitor. Here, polysilicon layer 13 is sufficiently deposited, so that the contact holes should be fully filled.

Insulating layer 14 is deposited on polysilicon layer 13, and another polysilicon layer 15 is deposited thereupon for forming an upper node electrode. Photo resist is coated on polysilicon layer 15, and then photo resist pattern 16 is defined in the direction of the illustrated Y axis through exposing and developing with a capacitor forming mask. An anisotropic etching is carried out using insulating layer 12 as an etch inhibiting layer on the portion which is not protected by photo resist layer 16.

As illustrated in FIGS. 3A and 3B, photo resist pattern 16 is removed, and then polysilicon is deposited on the whole surface. An etch-back is carried out to form side wall spacer 19 between the lower and upper node electrodes. Thus, the upper and lower node electrodes are connected together, and the surface area is expanded, while the upper node electrode is made to be supported. Photo resist is spread to form a photo resist pattern through exposing and developing with a photo mask for defining a capacitor node pattern in the direction of the illustrated X axis. Then an etching is carried out.

Insulating layer 14 which is disposed between the upper and lower node electrodes is removed, so that a tunnel-structured capacitor node electrode may be formed.

FIG. 4 is a perspective view of the capacitor of the semiconductor device manufactured based on the above described conventional method.

In the process for formation of the capacitor based on the above described method, the contact hole for connecting the lower node electrodes and the substrate is directly opened. Therefore, if a misalignment occurs with other elements, the misalignment margin is very small. Further, during the formation of the tunnel structure, the supporting and connecting of the upper and lower plates of the tunnel are realized by the polysilicon side wall. Therefore, if there is an excessive etching during the etch-back for forming the side wall, then the upper node electrode (upper polysilicon layer) may collapse after the removal of insulating layer 14 (within the tunnel). Further, the contact hole passes through to the silicon substrate, and if there is a misalignment, during the removal of the insulating layer the etchant can intrude through the interlayer interface to etch insulating layer 11.

SUMMARY OF THE INVENTION

The present invention is intended to overcome the above-described disadvantages of conventional techniques.

Therefore, it is an object of the present invention to provide a process for formation of a capacitor for a semiconductor device, in which the upper node electrode of the capacitor is made to be supported by side wall spacers and a central pole to provide reinforced support and to increase the surface area, and, during the formation of the contact hole, a side wall spacer is first formed, and the contact hole is opened utilizing the side wall spacer, thereby expanding the misalignment margin.

In achieving the above and other objects, the process for formation of a capacitor according the present invention includes the steps of: (a) forming circuit elements on a semiconductor substrate, then forming first insulating layer 31, second insulating layer 32 and first conductive layer 33, and then depositing third insulating layer 34 and second conductive layer 35; (b) forming a photo resist pattern on second conductive layer 35 for forming a contact hole, then carrying out an anisotropic etching using second insulating layer 32 as an etch stop layer to form contact hole region "a", then removing the photo resist pattern, depositing a third conductive layer and etching back the third conductive layer to form side wall spacer 37 as a third conductive layer on the sides of first conductive layer 33, third insulating layer 34 and second conductive layer 35, and then, anisotropically etching first and second insulating layers 31 and 32 by using the first, second and third conductive layers as a mask to form contact hole "b"; (c) depositing fourth conductive layer 38 on the whole surface, and forming photo resist pattern 36 thereupon for defining a capacitor node in the direction of the Y axis; (d) anisotropically etching fourth conductive layer 38, second conductive layer 35, third insulating layer 34 and first conductive layer 33 by utilizing second insulating layer 32 as an etch stop layer and using photo resist pattern 36 as the mask, thereby forming the node electrode pattern in the Y axis direction; (e) removing photo resist pattern 36, depositing a fifth conductive layer on the whole surface, and etching back the fifth conductive layer to form side wall spacer 39 (composed of the fifth conductive layer) on the first node electrode pattern formed in the direction of the Y axis; and (f) forming photo resist pattern 36' for defining the node electrode of the capacitor in the direction of the X axis, and anisotropically etching the portion not protected by photo resist pattern 36' by using second insulating layer 32 as the etch stop layer, thereby defining the node electrode pattern in the X axis direction. Additionally, the process may include removing photo resist pattern 36 and third insulating layer 34, depositing a dielectric film, and forming a plate electrode.

In the above described process, the first to fifth conductive layers may comprise polysilicon, and the first and third insulating layers may comprise silicon oxide, while the second insulating layer may comprise silicon nitride.

In this manner, the capacitor is formed, with the upper and lower node electrodes of the capacitor forming a tunnel structure. Particularly, there is provided a central supporting pole for supporting the upper node electrode, so that the supporting strength should be reinforced, and the surface area should be increased. The connecting portion which is connected to the source and drain region (which is disposed below the supporting pole on the semiconductor substrate) is filled into a hole which is formed into the pole.

A dielectric thin film is deposited on the surface of the node electrode, and a plate electrode is formed thereupon, thereby completing the formation of the capacitor.

BRIEF DESCRIPTION OF THE DRAWINGS

The above object and other advantages of the present invention will become more apparent by describing in detail the preferred embodiments of the present invention with reference to the attached drawings in which:

FIGS. 1A to 3B illustrate a conventional process for formation of a capacitor for a semiconductor device;

DESCRIPTION OF THE PREFERRED EMBODIMENTS

FIGS. 6A to 12C illustrate a process for formation of a capacitor for a semiconductor device according to the present invention. In these drawings, a portion of the semiconductor device is shown in sectional views, first views (i.e., FIGS. 6A, 7A, 8A, etc.) are in the direction of the X axis, second views (i.e., FIGS. 6B, 7B, 8B, etc.) are in the direction of the Y axis, while third views (i.e., FIGS. 6C, 7C, 8C, etc.) are top plan views.

Figure 6A:
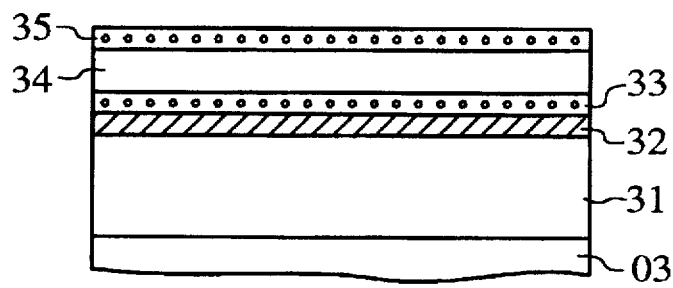
FIGS. 6A to 12C illustrate a process for formation of a capacitor for a semiconductor device according to the present invention.
Figure 6B:
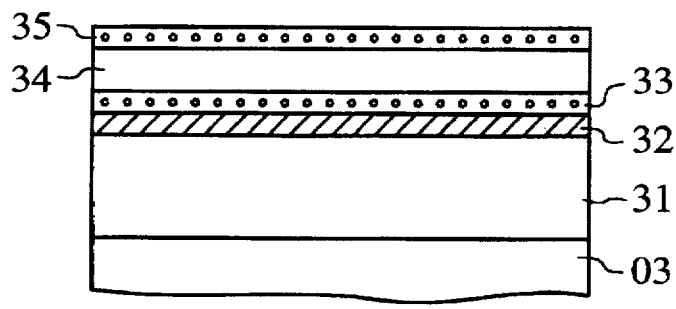
Figure 6C:
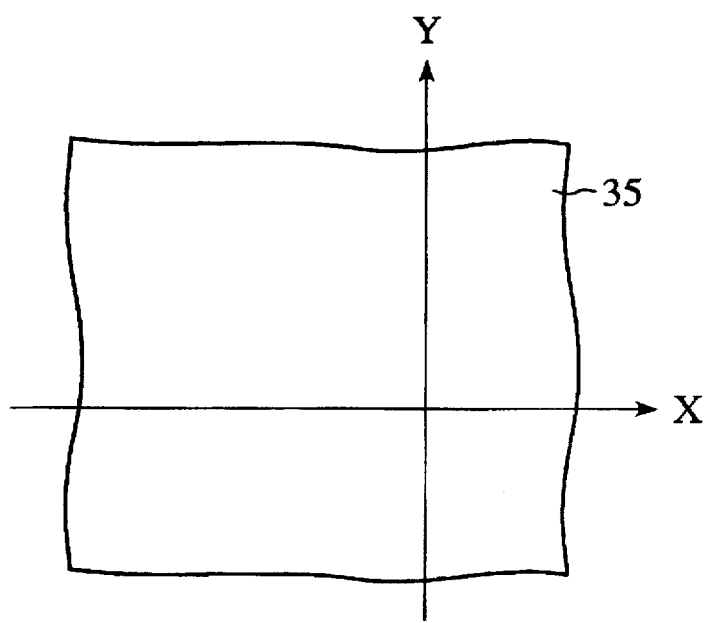

First, with reference to FIGS. 6A to 6C, silicon substrate 03 is provided, on which circuit elements such as transistors are formed. Word lines (not shown) and bit lines (not shown) also are formed. Then, first insulating layer 31 is deposited thereupon, and a flattening is carried out. Second insulating layer 32 in the form of a nitride layer is deposited, and polysilicon layer 33 for forming a lower node electrode is formed thereupon. Third insulating layer 34 in the form of a silicon oxide layer is deposited, and polysilicon layer 35 for forming an upper node electrode is deposited thereupon.

Figure 7A:
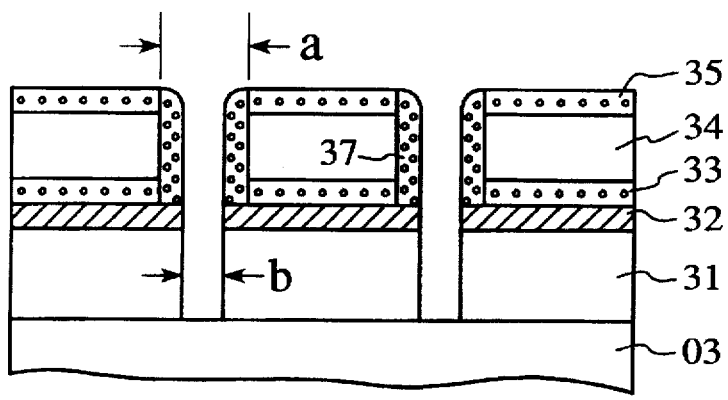
Figure 7B:
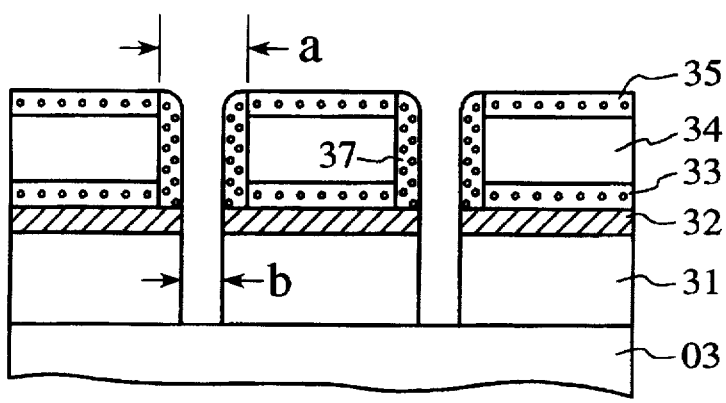
Figure 7C:
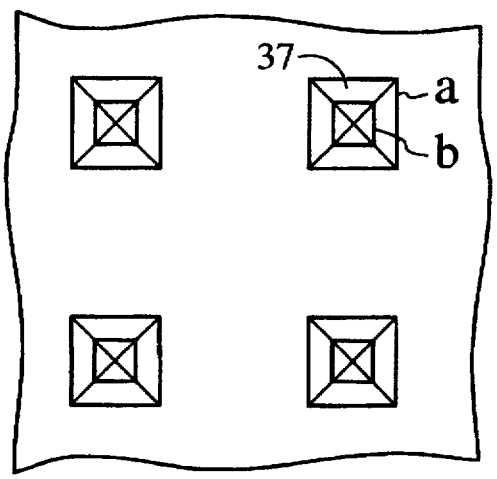

As illustrated in FIGS. 7A to 7C, photo resist is coated on polysilicon layer 35, and a photo resist pattern is defined through exposing and developing with a contact hole mask. An anisotropic etching is carried out on upper node electrode-forming polysilicon layer 35, third insulating layer 34, lower node electrode-forming polysilicon layer 33 in the cited order using second insulating layer 32 as an etch stop layer, thereby forming regions "a". The photo resist pattern is then removed, and polysilicon is deposited and etched back, so that the sides of node electrodes 35 and 33 and the sides of exposed third insulating layer 34 may be provided with side wall spacers 37 which support the upper node electrode. The hole which will be formed by being surrounded by side wall spacers 37 is smaller than the contact hole mask (i.e., hole regions "b" are smaller than hole regions "a").

An anisotropic etching is carried out on second insulating layer 32 and first insulating layer 31, so that a connection is to be formed with the element which lies under first insulating layer 31, thereby forming a contact hole. The contact hole thus formed increases the overlap margin for the active region by twice the thickness of the spacer.

Figure 8A:
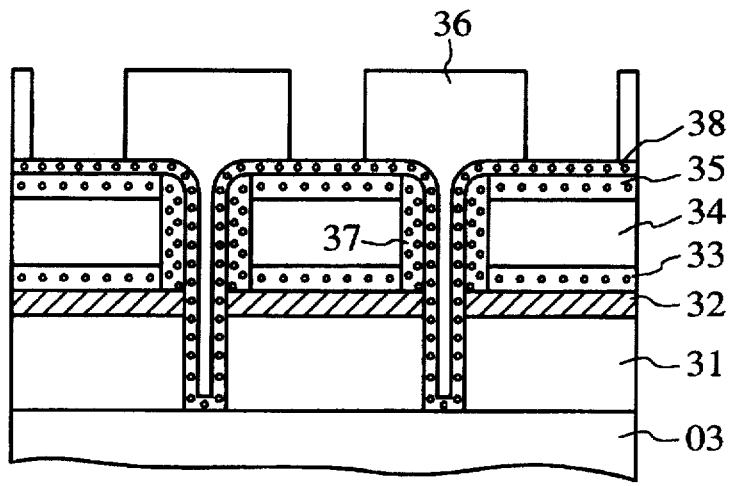
Figure 8B:
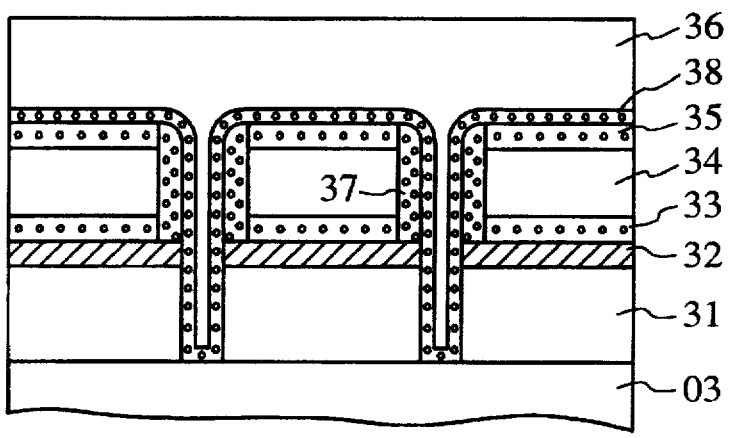
Figure 8C:
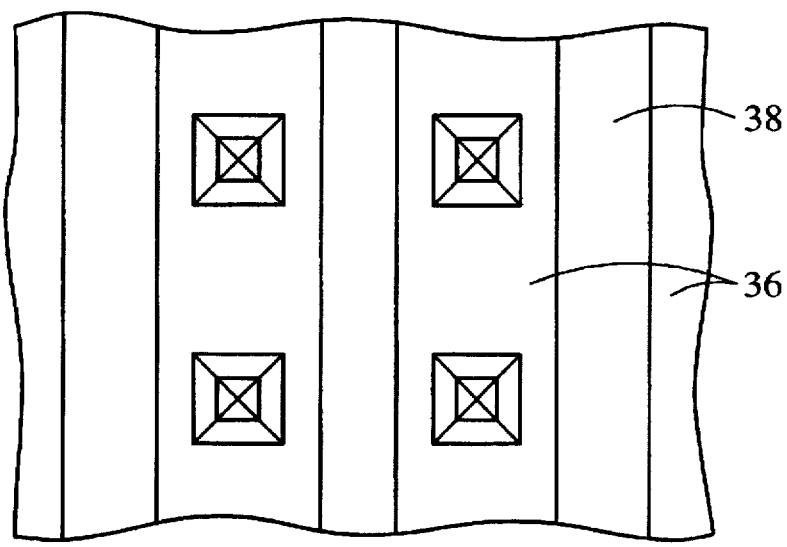

As illustrated in FIGS. 8A to 8C, polysilicon layer 38 is deposited on the whole surface, so that the node electrode of the capacitor is connected with the element region (source/drain region) which is formed in silicon substrate 03. Then, photo resist is coated thereupon, and photo resist pattern 36 is defined through exposing and developing with a photo mask for defining the node electrode in the direction of the Y axis (refer to the plan view of FIG. 8C).

Figure 9A:
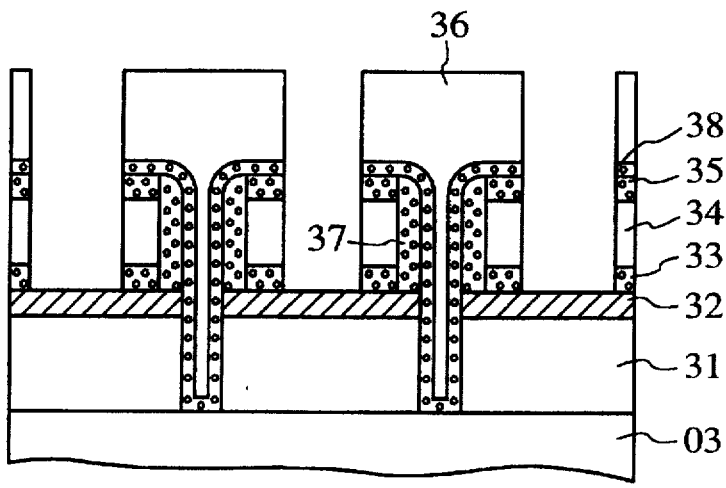
Figure 9B:
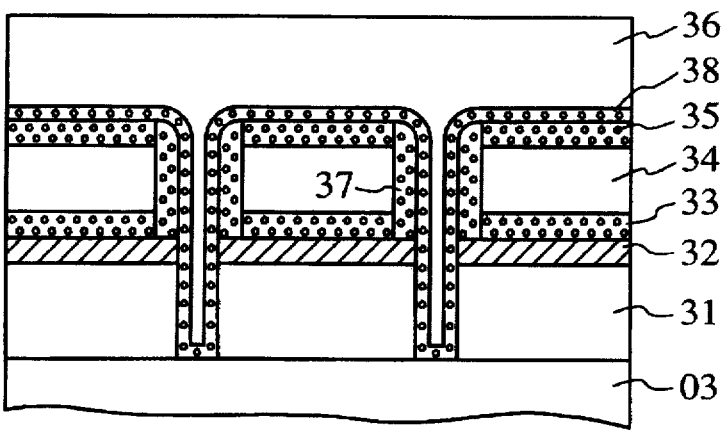
Figure 9C:
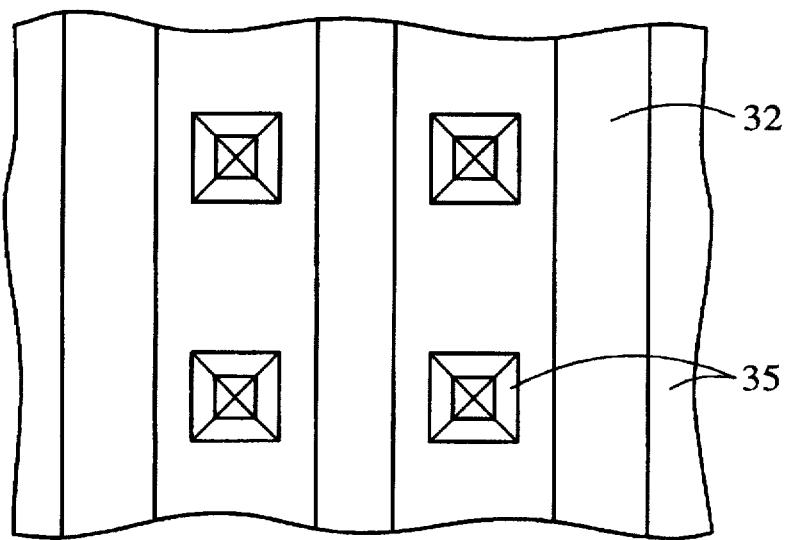

Then, as illustrated in FIGS. 9A to 9C, the portions which are not protected by photo resist pattern 36 are anisotropically etched by using the nitride layer of second insulating layer 32 as an etch stop layer, thereby defining the the node electrode pattern in the Y axis direction (storage node pattern of the capacitor), which forms a separation region between the adjacent capacitor, etc., as illustrated.

Figure 10A:
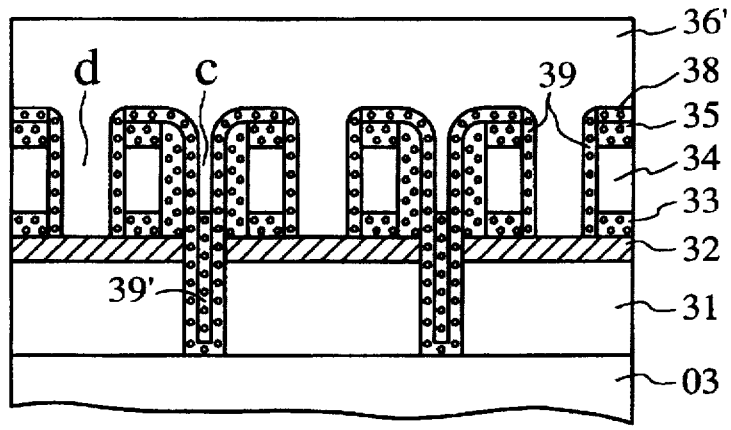
Figure 10B:
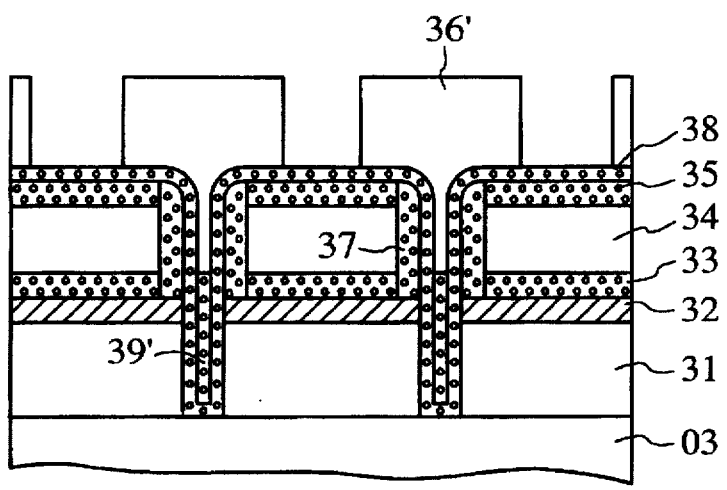
Figure 10C:
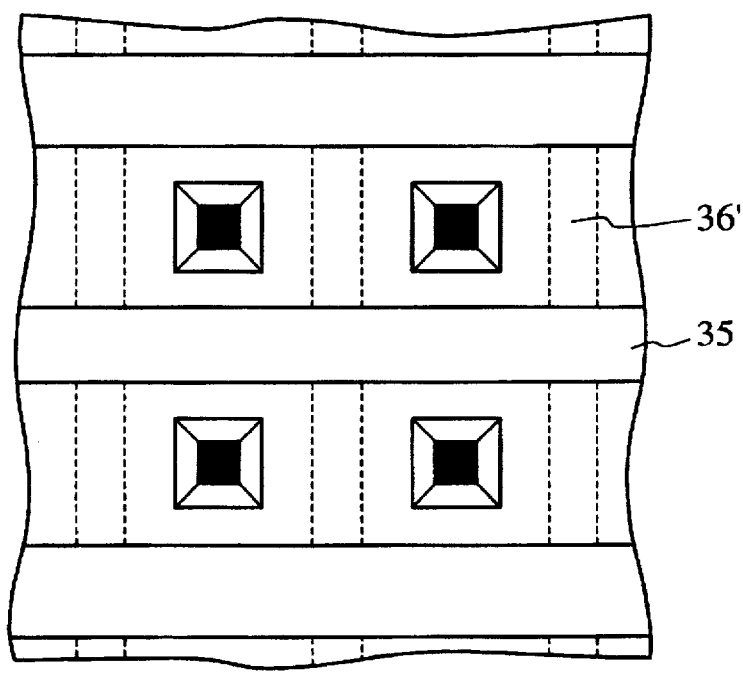

As illustrated in FIGS. 10A to 10C, photo resist pattern 36 is removed, and polysilicon is deposited on the whole surface, so that polysilicon film 38 formed within the contact hole may be grown in the sidewise direction until the hole is completely filled. An etch back is carried out so that side wall spacers 39 are formed on the sides of the upper and lower node electrodes and on the third insulating layer which is exposed during the formation of the node electrode pattern in the direction of the Y axis. Under this condition, owing to the different etch rates, the polysilicon which is deposited on regions "d" (which is formed during the node electrode pattern formation) is etched down to second insulating layer 32, while the polysilicon which is filled into upper portions "c" of the contact holes remain at a level higher than second insulating layer 32 (see plug 39' of FIGS. 10A and 10B, etc.). Therefore this latter polysilicon remains connected with polysilicon layer 33 for forming the lower node electrode.

Figure 12A:
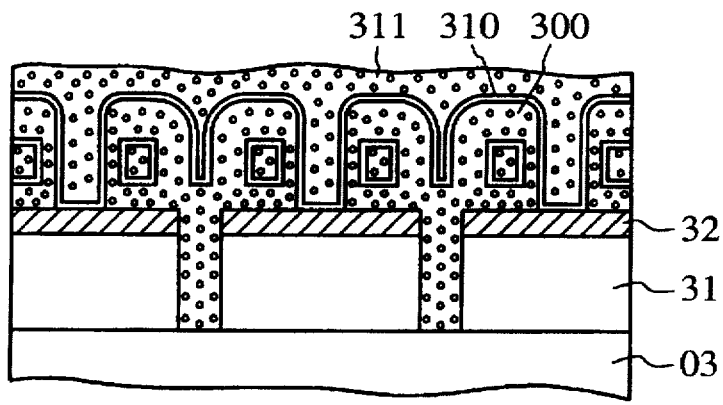

Photo resist is coated thereupon, and photo resist pattern 36' is defined through exposing and developing with a photo mask for defining node electrode 300 in the direction of the X axis (see FIG. 12A).

Figure 11A:
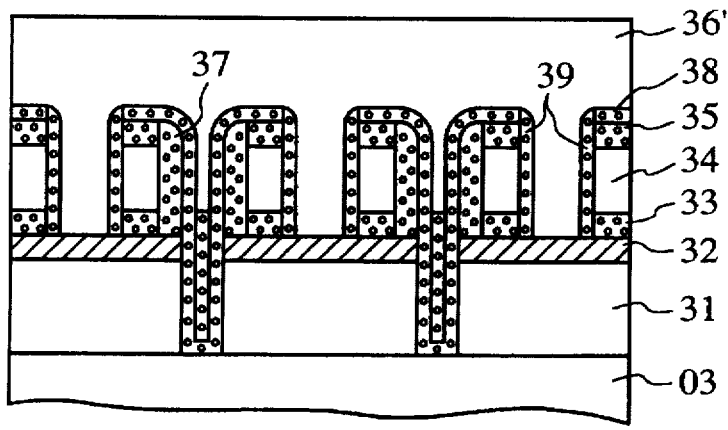
Figure 11B:
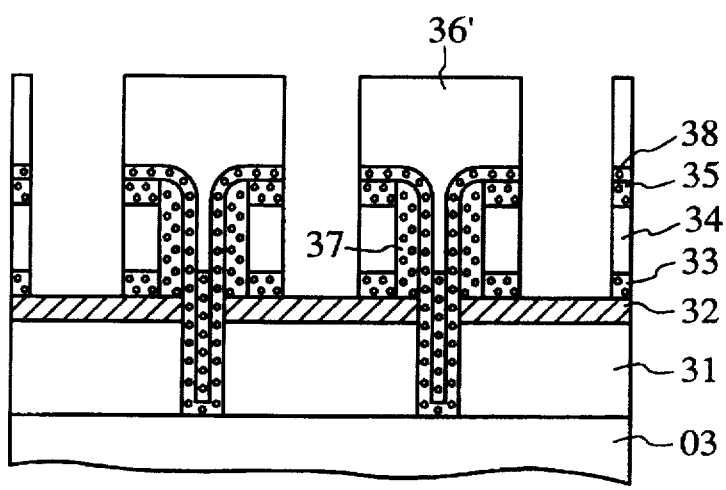
Figure 11C:
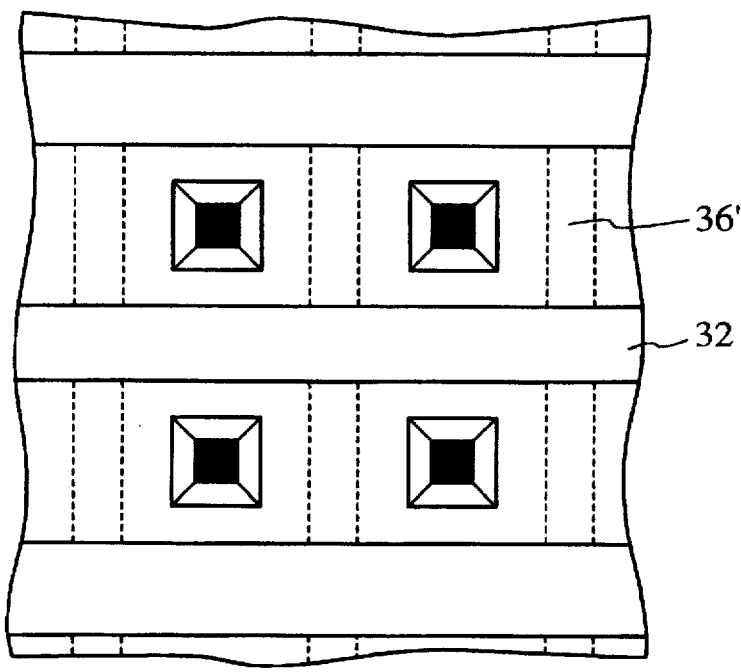

Then, as illustrated in FIGS. 11A to 11C, the portions which are not protected by photo resist pattern 36' are anisotropically etched using second insulating layer 32 as an etch inhibition layer, thereby defining the node electrode pattern in the X axis direction (as illustrated, the X axis direction is orthogonal to the Y axis direction). In the independent node thus formed, the side in the direction of the x axis is blocked by side wall spacer 39 (see FIG. 11A), while, in the side in the direction of the Y axis, a side of third insulating layer 34 is exposed (see FIG. 11B).

Figure 12B:
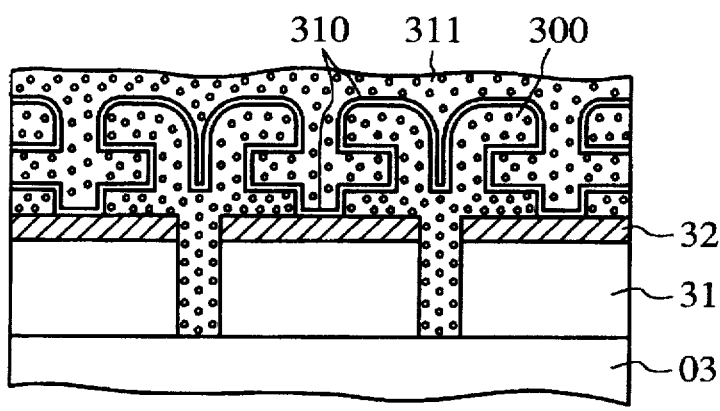
Figure 12C:
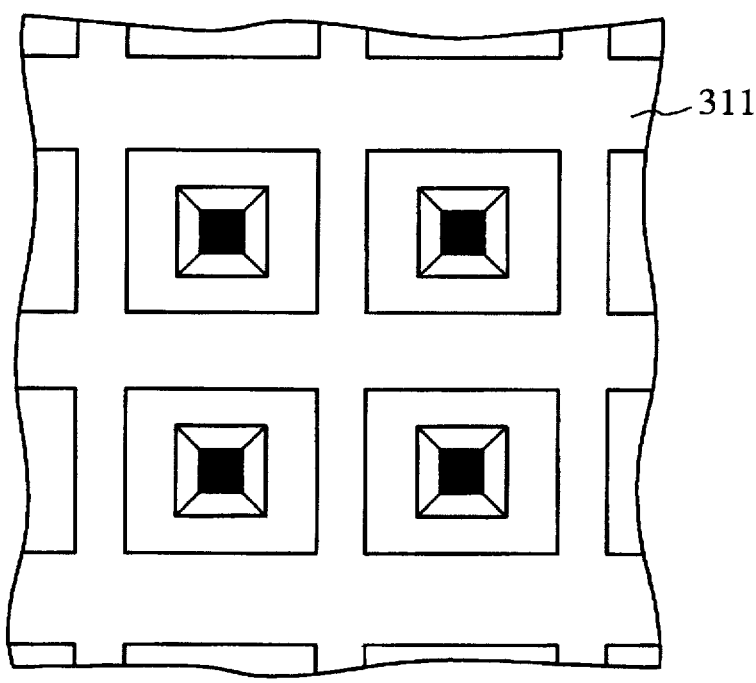

As illustrated in FIGS. 12A to 12C photo resist pattern 36' is removed, and the exposed surface of the capacitor electrode is washed, while exposed third insulating layer 34 is removed. Under this condition, first insulating layer 31 is not etched as it is protected by second insulating layer 32 and the lower node electrode-forming polysilicon layer 33. Then, thin dielectric film 310 is deposited on the whole surface, and polysilicon layer 311 is deposited to form a plate electrode. As illustrated, a capacitor is formed consisting of node electrode 300, dielectric film 310 and plate electrode 311. Also, it should be noted that, for purposes of clarity, the lines indicating the constituent elements of node electrode 300 (such as layers 33, 35, 37, 38, 39, etc.) have been omitted from FIGS. 12A and 12B.

Figure 4:
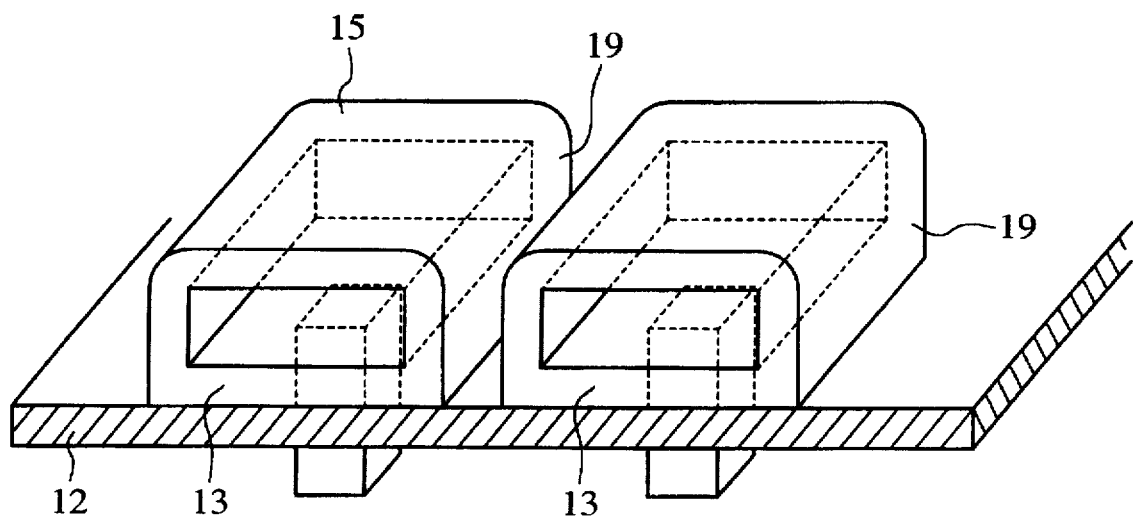
FIG. 4 is a see-through perspective view of the completed conventional capacitor for a semiconductor device.
Figure 5:
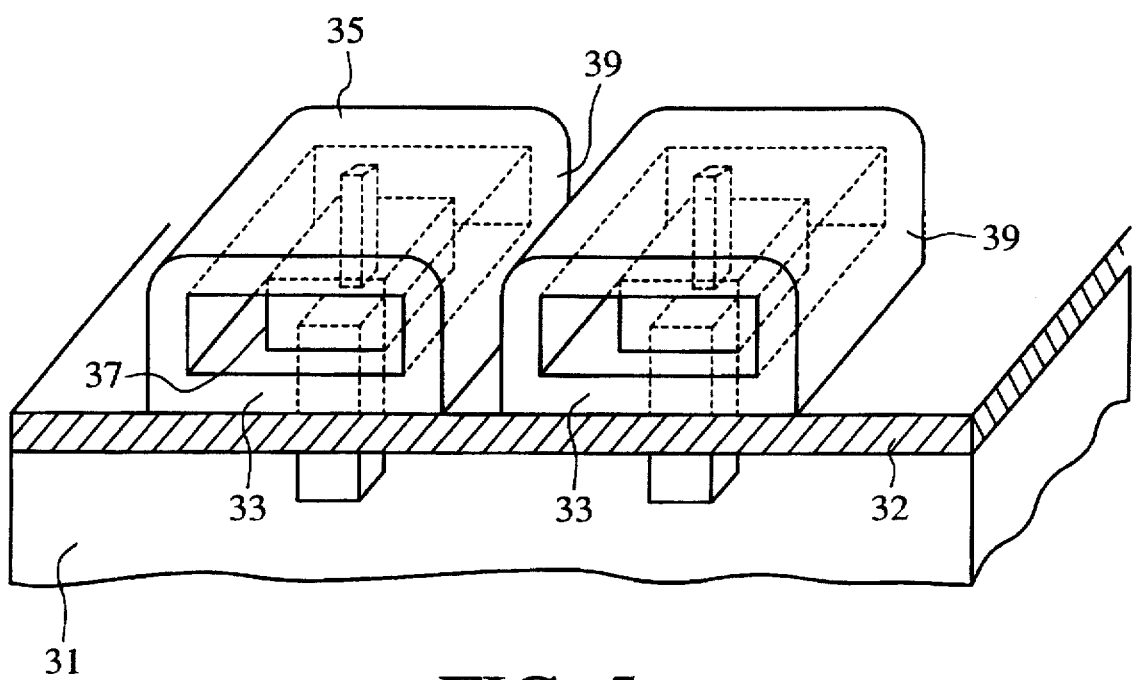
FIG. 5 is a see-through perspective view of a capacitor for a semiconductor device according to the present invention.

FIG. 5 is a see-through perspective view showing a capacitor node electrode for a semiconductor device according to the present invention.

In the present invention, two tunnels are provided in the size of one of the conventional tunnel type capacitor. Further, central pole shaped spacers 37 and side wall spacers of the opposite sides of the X axis of the node electrode are provided for reinforcing the supporting and connecting means for the upper and lower node electrodes.

According to the present invention as described above, during the formation of the contact hole for connecting the node electrodes and the silicon substrate, first side wall spacers are formed, and then, by utilizing the side wall spacers, the contact hole is formed. Thus, the overlap margin of the contact hole as against the active region is about doubly increased. The central spacer which is formed on the center of the node supports the upper node electrode, so that collapse may be prevented, and a wider effective area can be secured, thereby increasing the capacitance. Further, the photo masking process is carried out twice, but the width of the contact hole is decreased to increase the misalignment margin. Thus, if observed in a plan view, the area of the node is increased as much as the thickness of the side wall spacer, so that the area of the node can be increased more than that of the mask without encountering such process difficulties. As a result, the separation distance between the capacitors can be minimized, and the decrease of the effective area which is seen in the conventional single round photo masking process can be prevented.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for formation of a capacitor for a semiconductor device comprising the steps of:

(a) forming a first insulating layer on a semiconductor substrate, a second insulating layer on the first insulating layer, a first conductive layer on the second insulating layer, a third insulating layer on the first conductive layer, and a second conductive layer on the third insulating layer, (b) forming a first photo resist pattern as a first mask on the second conductive layer for forming a hole, carrying out an anisotropic etching using the second insulating layer as an etch stop layer to form a contact hole region, removing the first photo resist pattern, forming a third conductive layer and etching back the third conductive layer to form first side wall spacers on the sides of the first conductive layer, the third insulating layer and the second conductive layer, and anisotropically etching the first and second insulating layers by using the first, second and third conductive layers as the mask to form a contact hole;

(c) forming a fourth conductive layer on the third conductive layer and the first side wall spacer and in the contact hole;

(d) forming a second photo resist pattern on the fourth conductive layer and anisotropically etching the fourth conductive layer, the second conductive layer, the third insulating layer and the first conductive layer in a first direction using the second photo resist pattern as a second mask;

(e) forming second side wall spacers on the sides of the fourth conductive layer, the second conductive layer, the third insulating layer and the first conductive layer;

(f) forming a third photo resist pattern on the fourth conductive layer and the second side wall spacers and anisotropically etching the fourth conductive layer, the second conductive layer, the third insulating layer and the first conductive layer in a second direction orthogonal to the first direction using the third photo resist pattern as a third mask, wherein a node electrode of the capacitor is formed; and (g) removing exposed portions of the third insulating layer, forming a dielectric film, and forming a fifth conductive layer to form a plate electrode.

2. The process of claim 1, wherein the first to fourth conductive layers comprise polysilicon.

3. The process of claim 1, wherein the first and third insulating layers comprise silicon oxide, and the second insulating layer comprises silicon nitride.

4. The process of claim 1, wherein the fifth conductive layer comprises polysilicon or a metal.

* * * * *

UNITED STATES PATENT AND TRADEMARK OFFICE
CERTIFICATE OF CORRECTION

PATENT NO. : 5,698,375
DATED      : Dec. 16, 1997
INVENTOR(S): Seung Hyun Park

It is certified that error appears in the above-identified patent and that said Letters Patent is hereby corrected as shown below:

Column 1, line 38, delete "1AA, 1BB, 1CC" and insert --1B, 2B, 3B--

Signed and Sealed this

Seventh Day of April, 1998

Attest:

BRUCE LEHMAN

*Attesting Officer*    Commissioner of Patents and Trademarks